United States Patent
Watanabe et al.

(10) Patent No.: US 11,543,366 B2
(45) Date of Patent: Jan. 3, 2023

(54) INFORMATION ACQUISITION METHOD, INFORMATION ACQUISITION APPARATUS, AND RECORDING MEDIUM

(71) Applicants: Taishi Watanabe, Tokyo (JP); Kensuke Sekihara, Tokyo (JP)

(72) Inventors: Taishi Watanabe, Tokyo (JP); Kensuke Sekihara, Tokyo (JP)

(73) Assignees: Ricoh Company, Ltd., Tokyo (JP); Tokyo Metropolitan University, Tokyo (JP)

( * ) Notice: Subject to any disclaimer, the term of this patent is extended or adjusted under 35 U.S.C. 154(b) by 478 days.

(21) Appl. No.: 16/816,353

(22) Filed: Mar. 12, 2020

(65) Prior Publication Data
US 2020/0300783 A1 Sep. 24, 2020

(30) Foreign Application Priority Data
Mar. 20, 2019 (JP) .............................. JP2019-052524

(51) Int. Cl.
 *G01N 23/04* (2018.01)
 *G06T 11/00* (2006.01)
 *G01R 33/035* (2006.01)

(52) U.S. Cl.
CPC ......... *G01N 23/04* (2013.01); *G01R 33/0354* (2013.01); *G06T 11/003* (2013.01); *G01N 2223/401* (2013.01)

(58) Field of Classification Search
None
See application file for complete search history.

(56) References Cited

U.S. PATENT DOCUMENTS

| 5,706,813 A | * | 1/1998 | Filler | G01R 33/385 |
| | | | | 324/318 |
| 2011/0313274 A1 | * | 12/2011 | Subbarao | A61B 5/05 |
| | | | | 600/409 |

(Continued)

FOREIGN PATENT DOCUMENTS

| CN | 109410195 | * 3/2019 |
| JP | H08-196517 | 8/1996 |

(Continued)

OTHER PUBLICATIONS

Lu et al. (CN 109410195 A translated) (Year: 2019).*

(Continued)

*Primary Examiner* — Tapas Mazumder
(74) *Attorney, Agent, or Firm* — Harness, Dickey & Pierce, P.L.C.

(57) ABSTRACT

An information acquisition method includes: executing a voxel defining process to divide an area in which a signal source is assumed to be present and define a voxel division V1 specifying resolution of an image; executing a data collecting process to acquire magnetic field data resulting from measurement of a magnetic field generated in the area; and executing a reconstructing process to estimate, by using a mathematical algorithm, a direction and strength of a current of a signal source at a location of each voxel based on the acquired magnetic field data. The reconstructing process includes: calculating a Gram matrix by using a voxel division V2 defined coarser than the voxel division V1; and reconstructing, by using the Gram matrix, a direction and strength of a current of a signal source in the voxel division V1.

3 Claims, 4 Drawing Sheets

(56) References Cited

U.S. PATENT DOCUMENTS

2018/0008223 A1  1/2018  Yamagata
2018/0333062 A1  11/2018  Watanabe

FOREIGN PATENT DOCUMENTS

| JP | 2009-219717 | 10/2009 |
| JP | 4952914 | 6/2012 |
| JP | 2018-011952 | 1/2018 |
| JP | 2018-192236 | 12/2018 |

OTHER PUBLICATIONS

Kumihashi, et al.: "Array-Gain Constraint Minimum-Norm Spatial Filter With Recursively Updated Gram Matrix For Biomagnetic Source Imaging", IEEE Transactions On Biomedical Engineering, vol. 57, No. 6, Jun. 2010.

* cited by examiner

RESULT OF RENS

RESULT OF RENS mark2

INFORMATION ACQUISITION METHOD, INFORMATION ACQUISITION APPARATUS, AND RECORDING MEDIUM

CROSS-REFERENCE TO RELATED APPLICATIONS

The present application claims priority under 35 U.S.C. § 119 to Japanese Patent Application No. 2019-052524, filed on Mar. 20, 2019. The contents of which are incorporated herein by reference in their entirety.

BACKGROUND OF THE INVENTION

1. Field of the Invention

The present invention relates to an information acquisition method, an information acquisition apparatus, and a recording medium.

2. Description of the Related Art

It is a common technology to estimate a direction and strength of a current of a signal source measured by a measurement sensor by using a mathematical algorithm (for example, a recursive null-steering (RENS) spatial filter).

For example, Japanese Patent Application Publication No. 2009-219717 discloses a superconducting magnetometer that is capable of measuring weak magnetism generated by a subject.

Such a type of superconducting magnetometer disclosed in the above-mentioned literature acquires the direction and strength of the current of a signal source that generates weak magnetism. However, there has been a problem that quite a long time is required for the processing due to use of the mathematical algorithm.

SUMMARY OF THE INVENTION

An information acquisition method according to one aspect of the present invention is implemented by a computer as an information acquisition apparatus for estimating a direction and strength of a current of a signal source. The method includes: executing a voxel defining process to divide an area in which a signal source is assumed to be present and define a voxel division V1 specifying resolution of an image; executing a data collecting process to acquire magnetic field data resulting from measurement of a magnetic field generated in the area; and executing a reconstructing process to estimate, by using a mathematical algorithm, a direction and strength of a current of a signal source at a location of each voxel based on the acquired magnetic field data. The reconstructing process includes: calculating a Gram matrix by using a voxel division V2 defined coarser than the voxel division V1; and reconstructing, by using the Gram matrix, a direction and strength of a current of a signal source in the voxel division V1.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

The present invention is directed to enhancement of reducing the processing time in use of a mathematical algorithm without sacrificing the accuracy of results of reconstruction.

Embodiments of an information acquisition method, an information acquisition apparatus, and a recording medium will now be described in detail with reference to the accompanying drawings.

Figure 1:
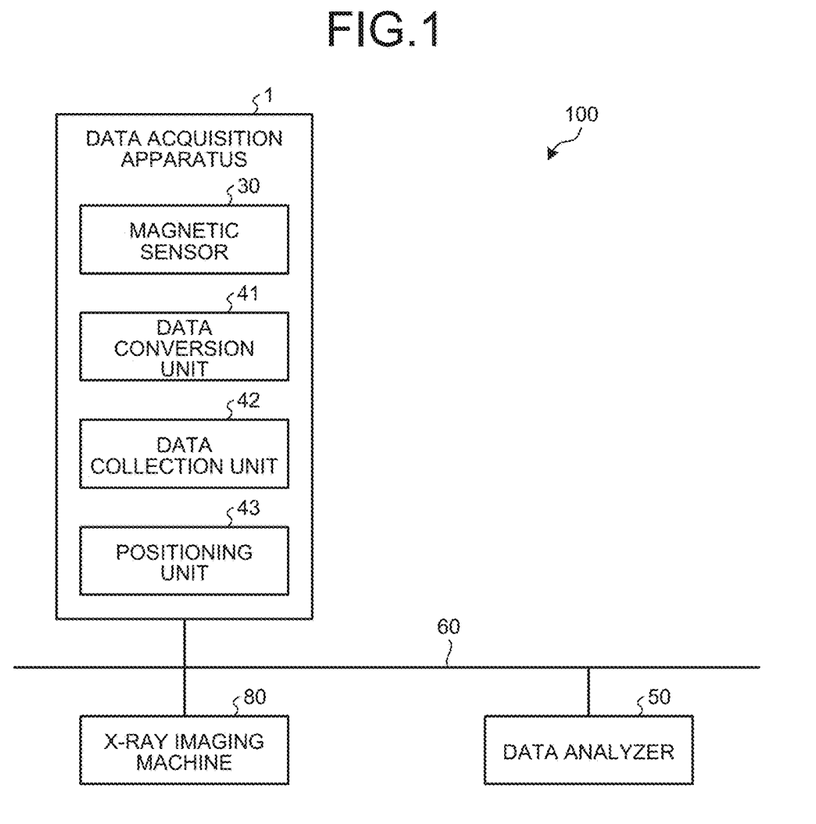
FIG. 1 is a block diagram that illustrates a configuration of an information acquisition system according to an embodiment.

FIG. 1 is a block diagram that illustrates a configuration of an information acquisition system 100 of an embodiment. As illustrated in FIG. 1, the information acquisition system 100 includes a data acquisition apparatus 1, a data analyzer 50 as an information acquisition apparatus, and an X-ray imaging machine 80. The data acquisition apparatus 1, the data analyzer 50, and the X-ray imaging machine 80 are connected with one another over a communication line 60 such as a local area network (LAN).

The data acquisition apparatus 1 is a superconducting magnetometer that can measure, by using a magnetic sensor 30, weak magnetism generated by a subject. The magnetic sensor 30 may use, for example, a known superconducting quantum interference device (SQUID) magnetometer (superconducting magnetic sensor) capable of detecting extremely weak magnetic fields.

Figure 2:
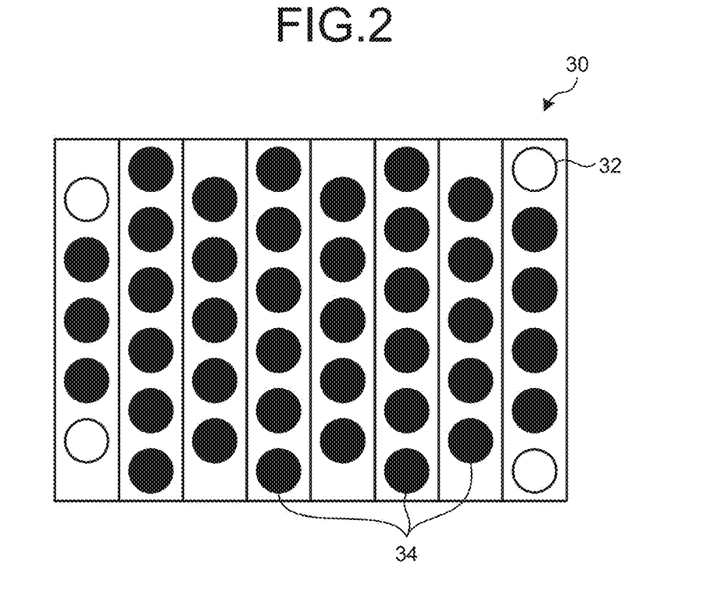
FIG. 2 is a schematic diagram of an example magnetic sensor array.

FIG. 2 is a schematic diagram of an example magnetic sensor array. In the present embodiment, a 124-ch supine-type SQUID (sensor) system includes 124 channels of SQUID magnetometers. As illustrated in FIG. 2, a sensor array of the 124-ch supine-type SQUID (sensor) system, which is the magnetic sensor 30, includes 40 channels of sensors for measuring the magnetic field in the X direction, 40 channels for the magnetic field in the Y direction, and 44 channels for the magnetic field in the Z direction. As illustrated in FIG. 2, array sensors 34 for measuring magnetic fields in the X and Y directions are arranged as indicated by black circles. Array sensors 32 for measuring a magnetic field in the Z direction are arranged at four corners as indicated by hollow circles, in FIG. 2. Each system has a calculation area of 160 mm×110 mm in the present embodiment.

For example, a 120-ch supine-type SQUID (sensor) system has 40 channels arranged in a matrix of 5×8 for each of the X, Y, and Z directions. Each system may have a calculation area of 140 mm×90 mm.

The array sensors are not necessarily arranged in a staggered pattern as illustrated in FIG. 2. The array sensors only need to be arranged two-dimensionally. The sensor array is not limited to be completely flat, and may be in another shape. For example, the sensor array may be concave.

The data acquisition apparatus 1 measures a magnetic field generated by a target part of a subject. The subject is positioned at a given distance from the magnetic sensor 30. The data acquisition apparatus 1 further includes a data conversion unit 41 that converts magnetic data detected by the magnetic sensor 30 into digital data, and a data collection unit 42 that collects the digital data converted by the data conversion unit 41.

The data acquisition apparatus 1 further includes a positioning unit 43. The positioning unit 43 is used for determining the location of a subject with respect to the magnetic sensor 30 on a three-dimensional coordinate system. For example, a plurality of small coils is attached to several parts of the subject, and the positioning unit 43 supplies power to the coils. The magnetic sensor 30 detects the magnetic fields generated by the coils, thereby determining the location of the subject with respect to the magnetic sensor 30.

The X-ray imaging machine 80 takes X-ray images of the parts of the subject that generate the magnetic fields measured by the magnetic sensor 30 of the data acquisition apparatus 1.

The data analyzer 50 performs various processing, such as identification of a current source within a diagnostic area of the subject and analysis of the source, based on the magnetic field data collected by the data collection unit 42 of the data acquisition apparatus 1.

Figure 3:
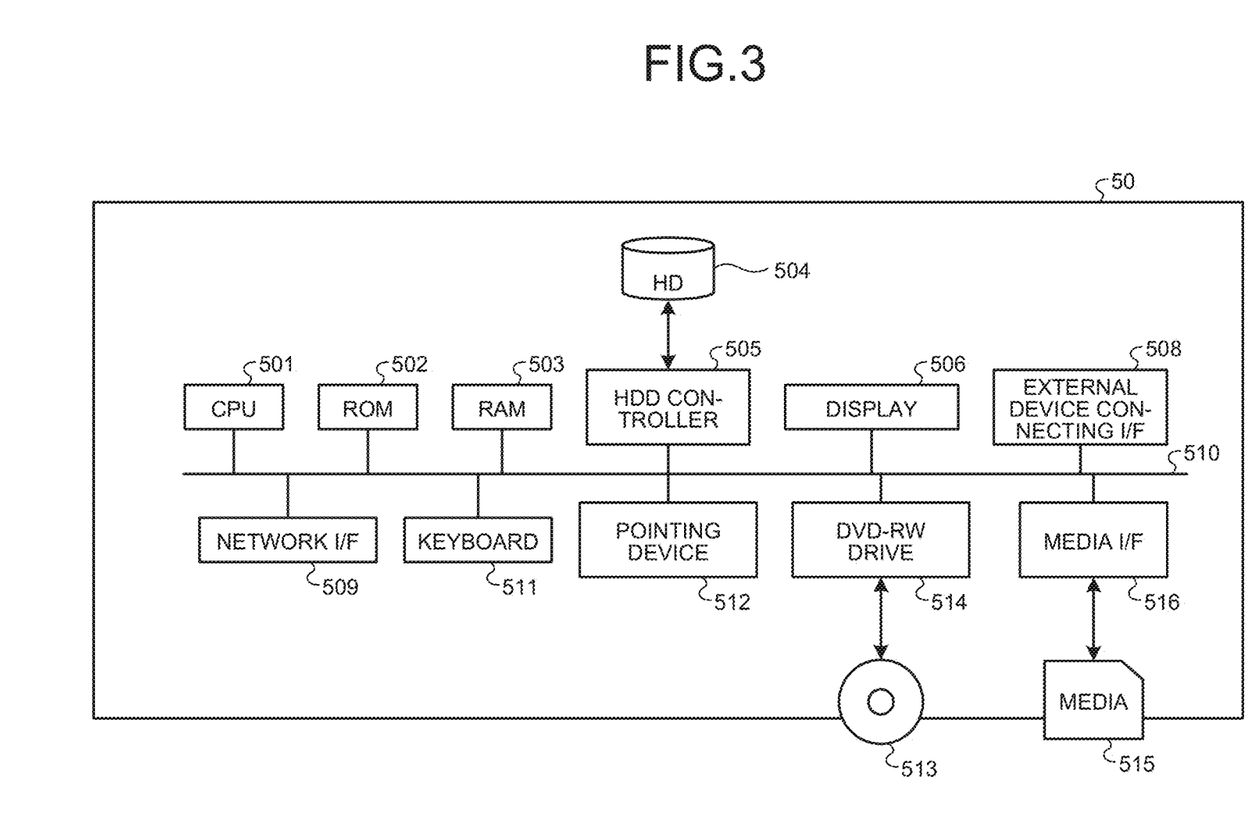
FIG. 3 is a drawing of an example hardware configuration of a data analyzer.

FIG. 3 is a drawing of an example hardware configuration of the data analyzer 50. The hardware configuration of the data analyzer 50 will be described.

As illustrated in FIG. 3, the data analyzer 50 is constructed as a computer. The data analyzer 50 includes a CPU 501, an ROM 502, an RAM 503, a HD 504, a hard disk drive (HDD) controller 505, a display 506, an external device connecting interface (I/F) 508, a network I/F 509, a bus line 510, a keyboard 511, a pointing device 512, a digital versatile disc rewritable (DVD-RW) drive 514, and a media I/F 516.

The CPU 501 is an example of a hardware processor and integrally controls the operation of the data analyzer 50. The ROM 502 stores a computer program to start the CPU 501, such as the initial program load (IPL). The RAM 503 is used as a work area of the CPU 501.

The HD 504 stores various types of data such as an information acquisition program, for example, to cause the computer to identify a current source within a diagnostic area of the subject and to analyze the source. The HDD controller 505 controls operation to the HD 504 such as loading or writing of data to the HD 504, under control of the CPU 501.

The display 506 displays various types of information such as a cursor, a menu, a window, letters, and an image.

The external device connecting I/F 508 is an interface to connect various external apparatuses. In this configuration, examples of the external apparatus include a universal serial bus (USB) memory and a printer.

The network I/F 509 is an interface to establish data communication using a network 3 and a local network 4. The bus line 510 is, for example, an address bus and a data bus to electrically connect components such as the CPU 501 illustrated in FIG. 3 with one another.

The keyboard 511 is a type of input unit having a plurality of keys for inputting letters, numerals, various commands, and others. The pointing device 512 is another type of input unit for, for example, selecting and executing various commands, selecting a target, and moving the cursor.

The DVD-RW drive 514 controls loading or writing of data to a digital versatile disc rewritable (DVD-RW) 513 as an example removable recording medium. This is not limited to the DVD-RW, and is replaceable by another media such as a digital versatile disc recordable (DVD-R). The media I/F 516 controls loading or writing (recording) of data to a recording medium 515 such as a flash memory.

In the DVD-RW 513, an image obtained by the X-ray imaging machine 80 is recorded. A current source, which is identified by the data analyzer 50, is displayed on the display 506 or printed and output from a color printer, overlapping on the tomographic images. The image obtained by the X-ray imaging machine 80 and other devices is directly transferred to the data analyzer 50 through the communication line 60.

Computer programs executed by the data analyzer 50 of the present embodiment may be recorded in a computer-readable recording medium such as a CD-ROM, a flexible disk (FD), a CD-R, and a DVD in a file with an installable or an executable format and provided.

The computer programs executed by the data analyzer 50 of the present embodiment may be stored in a computer connected to a network such as the Internet and provided by being downloaded over the network. The computer programs executed by the data analyzer 50 of the present embodiment may be provided or distributed over a network such as the Internet.

The following describes functions implemented with the CPU 501 of the data analyzer 50 by executing an information acquisition program stored in the HD 504. In the following description, functions conventionally known will be omitted, and characteristic functions implemented by the CPU 501 of the data analyzer 50 of the present embodiment will be described in detail.

Figure 4:
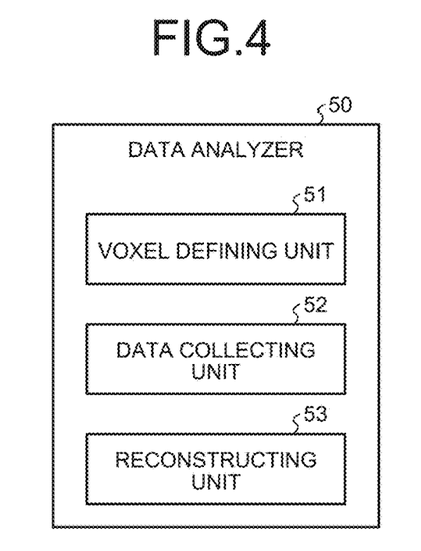
FIG. 4 is a drawing of example functions of the data analyzer.

FIG. 4 is a drawing of example functions of the data analyzer 50. As illustrated in FIG. 4, the data analyzer 50 includes a voxel defining unit 51, a data collecting unit 52, and a reconstructing unit 53.

The voxel defining unit 51 divides an area in which a signal source is assumed to be present and defines a voxel division V1 (described later) specifying resolution of an image.

The data collecting unit 52 acquires magnetic field data resulting from measurement of a magnetic field generated in the above-mentioned area.

The reconstructing unit 53 estimates, by using a mathematical algorithm, the direction and strength of the current of a signal source on each voxel based on the acquired magnetic field data. More specifically, the reconstructing unit 53 calculates a Gram matrix by using a voxel division V2 (described later) defined coarser than the voxel division V1, and reconstructs, by using the Gram matrix, the direction and the strength of the current of a signal source in the voxel division V1.

The following describes reconstruction processing performed by the data analyzer 50 on the signal source.

Figure 5:
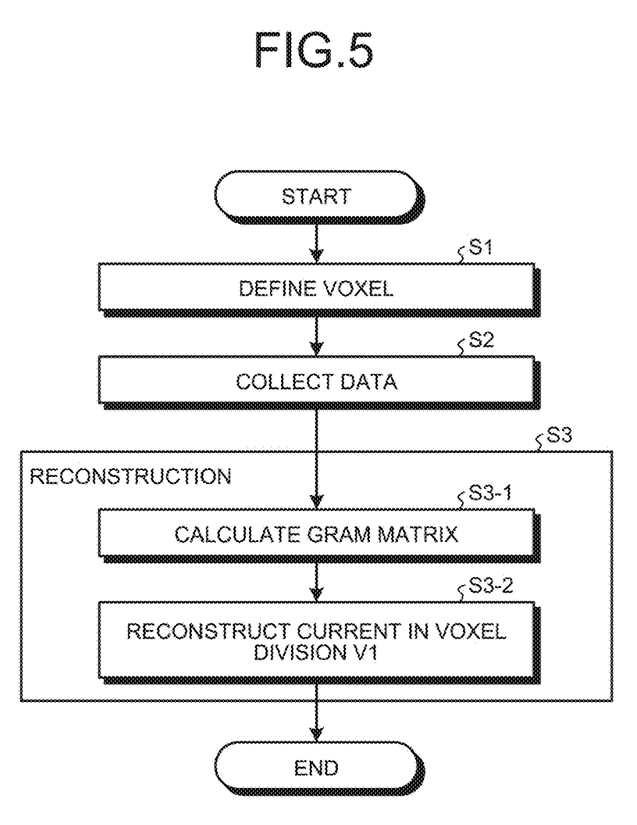
FIG. 5 is a flowchart that schematically illustrates a flow of reconstruction processing of a signal source.

FIG. 5 is a flowchart that schematically illustrates a flow of reconstruction processing of a signal source.

Step S1: Voxel Defining Process

As illustrated in FIG. 5, the data analyzer 50 (the voxel defining unit 51) divides an area in which a signal source is assumed to be present and defines a voxel division V1 (Step S1). The voxel division is a region in which the area where a signal source is assumed to be present is equally divided. A voxel refers to each individual divided region.

Step S2: Data Collection Process

The data analyzer 50 (the data collecting unit 52) acquires magnetic field data generated by neuro-electrical activity in the above area by measuring with the magnetic sensor 30 of the data acquisition apparatus 1 on the body surface (Step S2). Step S2 may take place before above Step S1.

Step S3: Reconstruction Process

The data analyzer 50 (the reconstructing unit 53) estimates, by using a mathematical algorithm, the direction and strength of a current at a location of each voxel, based on the magnetic field data acquired at Step S2.

The mathematical algorithm mentioned above may preferably be a recursive null-steering (RENS) spatial filter. The RENS spatial filter provides a method that artificially localizes the sensitivity distribution of the magnetic sensor 30 such that only a specific area on the sensitivity distribution has sensitivity. This method allows a signal source and the magnetic sensor 30 to be correlated with each other on a one-on-one basis. By scanning the area having localized sensitivity in an area having a signal source, the signal source is reconstructed in the form of a distribution.

As expressed in the following formula (1), a sequential computation part of the RENS spatial filter can be classified into two processes: (a) calculation of a Gram matrix; and (b) reconstruction of a neuroelectric activity current. The data analyzer 50 (the reconstructing unit 53) carries out the following two processes.

(1)

In the formula (1), $s(r,t)$ represents the vector of a reconstruction signal source at a location r at a time t. In the formula, $W(r)$ is a weight matrix of M×3 for signal source reconstruction, and is defined as $W(r)=[Wx(r), Wy(r), Wz(r)]$. The components $Wx(r)$, $Wy(r)$, and $Wz(r)$ are weights used for calculating respective components in the x, y, and z directions of the signal source vector.

In addition, G represents a Gram matrix, L represents a Lead field matrix, $b(t)$ represents measured magnetic field data, and $s(r,t)$ represents a signal source vector. $P(r)$ is any matrix for expressing discretization or a model of two measured values of $s=(r,t)$.

The RENS spatial filter reconstructs, by using the formula (1), a signal source vector $s(r,t)$ at a location r from measured magnetic field data $b(t)$ detected by the magnetic sensor 30.

Step S3-1

The data analyzer 50 (the reconstructing unit 53) calculates a Gram matrix by calculating the (a) part of the above formula (1) using a voxel division V2, which is coarser than the voxel division V1 acquired at Step S2.

Step S3-2

The data analyzer 50 (the reconstructing unit 53) reconstructs a neuroelectric activity current in the voxel division V1, by using the Gram matrix obtained at Step S3-1.

The above steps allow the data analyzer 50 to increase the processing speed of the RENS spatial filter without sacrificing the accuracy of final results of reconstruction.

As described above, in the present embodiment, the resolution of an image is specified with the voxel division V1, and the time of calculation is determined with the voxel division V2. The voxel division V1 is therefore preferably set to such a level of division that allows the quality of an image to be as fine as requested. The voxel division V2 is preferably set to a level that allows an increase in the speed of calculation for reconstruction while ensuring the accurate use of data obtained at the step of voxel division V1.

With regard to the size of a divided voxel, for example, a voxel subjected to a predetermined voxel division V1 preferably has a side of approximately 5 mm, whereas a voxel of the voxel division V2 preferably has a side of approximately 2 cm. In this arrangement, the calculation time is approximately one seventh as long as the time with an ordinary RENS spatial filter.

In the voxel division V2, the optimal size of a voxel after division depends on the distance between the part to be measured and the magnetic sensor 30, the quality of a signal, and other factors.

The above steps allow the data analyzer 50 to understand the flow of the neuroelectric activity current. The data analyzer 50 stores the obtained data in the HD 504 and other devices, and displays the data on the display 506 or other places.

In this manner, according to the present embodiment, the processing time of the RENS spatial filter can be reduced without sacrificing the accuracy of final results of reconstruction.

The present invention is not limited to the present embodiment described above, and various modifications can be made without departing from the spirit of the invention. For example, the magnetic sensor may be implemented as an optical pumping sensor, a tunnel magneto resistance (TMR) sensor, and an atomic absorption sensor. The sensor may have sensitivity only in a specific one direction.

EXAMPLES

The present invention will be described specifically with reference to an example of the present invention. It should be noted that the present invention is not limited to this example.

As an example, signal source estimation was performed using a signal source simulating a neuroelectric activity current. Above Steps S1 to S3 were conducted on magnetic field data obtained by a virtually set sensor array. The neuroelectric activity current was simulated as currents at four points separated from one another at regular intervals.

Figure 6:
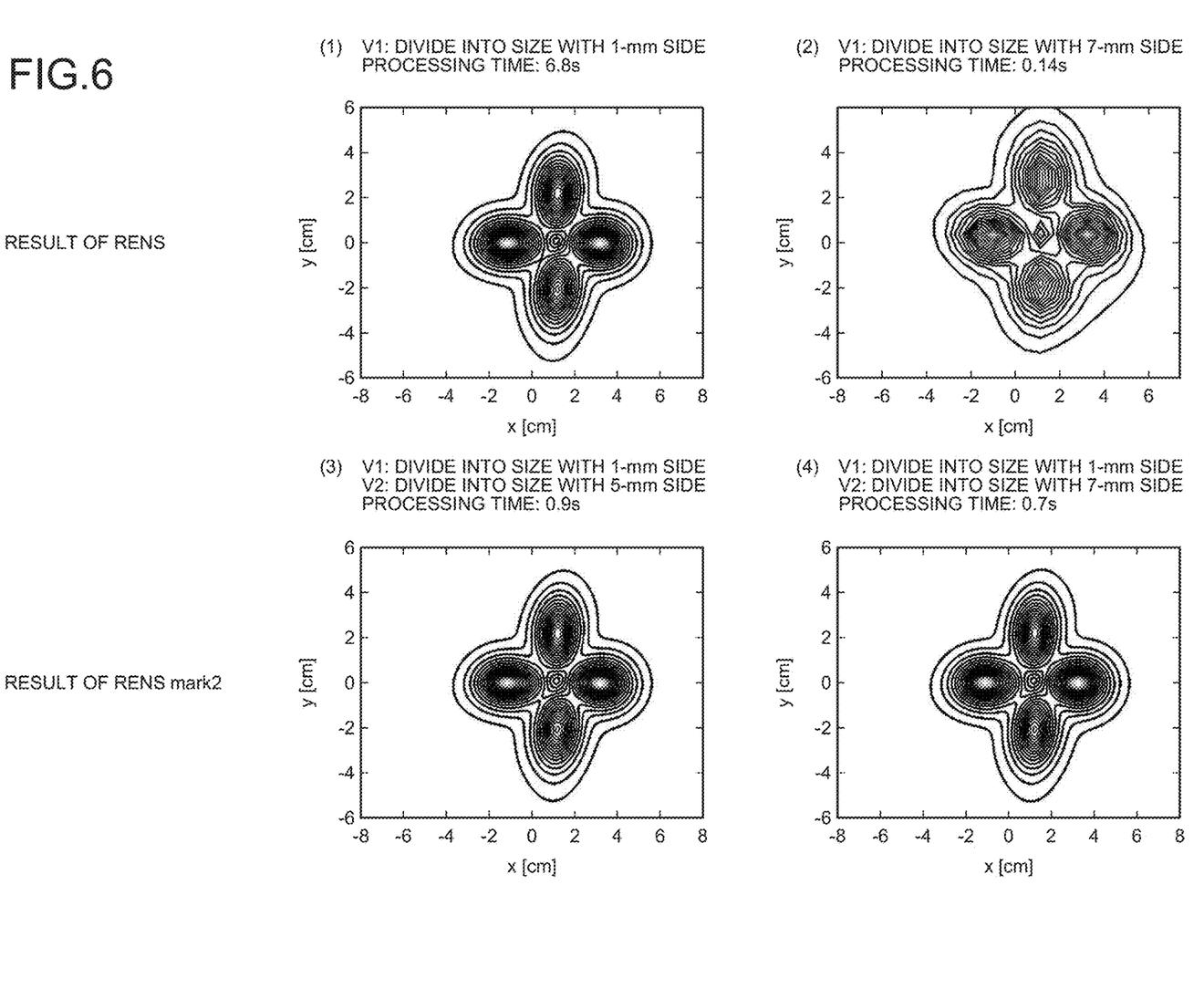
FIG. 6 is drawings that demonstrate results of examples.

FIG. 6 demonstrates the results of the above example. Results of example are indicated as RENS mark2 ((3) and (4) in FIG. 6). Comparative examples (using an ordinary RENS spatial filter), having experienced Steps S1 to S3 with V2=V1, are indicated as RENS ((1) and (2) in FIG. 6).

In FIG. 6, the result (1) demonstrates highly accurate current reconstruction. However, the processing time is 6.8 seconds. The result (3) achieves almost as accurate current reconstruction as that of the result (1) in approximately one seventh as long the processing time as the time of the result (1), by dividing voxels into a size with a 5-mm side in the voxel division V2.

The result (2) achieves high-speed processing by dividing the voxels into a size with a 7-mm side in the voxel division V1; however, the resolution is low and the obtained image is coarse. Although the processing time is comparatively long, the result (4) achieves almost the same results as those of the result (1) by dividing the voxels into a size with a 1-mm side in the voxel division V1 and dividing into a size with a 7-mm side in the voxel division V2.

According to the present invention, the processing time in use of a mathematical algorithm can be reduced while the accuracy of results of reconstruction is retained.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

The method steps, processes, or operations described herein are not to be construed as necessarily requiring their performance in the particular order discussed or illustrated, unless specifically identified as an order of performance or clearly identified through the context. It is also to be understood that additional or alternative steps may be employed.

Further, any of the above-described apparatus, devices or units can be implemented as a hardware apparatus, such as a special-purpose circuit or device, or as a hardware/software combination, such as a processor executing a software program.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, non-volatile memory, semiconductor memory, read-only-memory (ROM), etc.

Alternatively, any one of the above-described and other methods of the present invention may be implemented by an application specific integrated circuit (ASIC), a digital signal processor (DSP) or a field programmable gate array (FPGA), prepared by interconnecting an appropriate network of conventional component circuits or by a combination thereof with one or more conventional general purpose microprocessors or signal processors programmed accordingly.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. An information acquisition method implemented by a computer as an information acquisition apparatus for estimating a direction and strength of a current of a signal source, the method comprising:
   executing a voxel defining process to divide an area in which a signal source is assumed to be present and define a voxel division V1 specifying resolution of an image;
   executing a data collecting process to acquire magnetic field data resulting from measurement of a magnetic field generated in the area; and
   executing a reconstructing process to estimate, by using a mathematical algorithm, a direction and strength of a current of a signal source at a location of each voxel based on the acquired magnetic field data,
   wherein the reconstructing process includes:
   calculating a Gram matrix by using a voxel division V2 defined coarser than the voxel division V1; and
   reconstructing, by using the Gram matrix, a direction and strength of a current of a signal source in the voxel division V1.

2. An information acquisition apparatus comprising:
   a memory; and
   a hardware processor coupled to the memory and configured to:
   execute a voxel defining process to divide an area in which a signal source is assumed to be present and to define a voxel division V1 specifying resolution of an image;
   execute a data collecting process to acquire magnetic field data resulting from measurement of a magnetic field generated in the area; and
   execute a reconstructing process to estimate, by using a mathematical algorithm, a direction and strength of a current of a signal source at a location of each voxel based on the acquired magnetic field data,
   wherein the reconstructing process includes:
   calculating a Gram matrix by using a voxel division V2 defined coarser than the voxel division V1; and
   reconstructing, by using the Gram matrix, a direction and strength of a current of a signal source in the voxel division V1.

3. A non-transitory computer-readable recording medium on which an executable program is recorded, the program being executed by a computer as an information acquisition apparatus for estimating a direction and strength of a current of a signal source, the program instructing the computer to:
   execute a voxel defining process to divide an area in which a signal source is assumed to be present and to define a voxel division V1 specifying resolution of an image;

execute a data collecting process to acquire magnetic field data resulting from measurement of a magnetic field generated in the area; and execute a reconstructing process to estimate, by using a mathematical algorithm, a direction and strength of a current of a signal source at a location of each voxel based on the acquired magnetic field data, wherein the reconstructing process includes:

calculating a Gram matrix by using a voxel division V2 defined coarser than the voxel division V1; and reconstructing, by using the Gram matrix, a direction and strength of a current of a signal source in the voxel division V1.

\* \* \* \* \*